United States Patent
Kim

(10) Patent No.: US 12,131,769 B2
(45) Date of Patent: Oct. 29, 2024

(54) SUB-WORD LINE DRIVER HAVING COMMON GATE BOOSTED VOLTAGE

(71) Applicant: Micron Technology, Inc., Boise, ID (US)

(72) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 296 days.

(21) Appl. No.: 17/886,217

(22) Filed: Aug. 11, 2022

(65) Prior Publication Data

US 2024/0055043 A1    Feb. 15, 2024

(51) Int. Cl.
*G11C 11/408* (2006.01)

(52) U.S. Cl.
CPC ................ *G11C 11/4085* (2013.01)

(58) Field of Classification Search
CPC . G11C 11/4085; G11C 11/4074; G11C 5/063; G11C 5/145; G11C 8/08; G11C 8/14
See application file for complete search history.

(56) References Cited

U.S. PATENT DOCUMENTS

| 10,163,524 B2 * | 12/2018 | Walker .................. G11C 29/46 |
| 10,910,049 B2 | 2/2021 | Ingalls et al. |
| 2017/0062035 A1 * | 3/2017 | Antonyan ........... G11C 11/1697 |

* cited by examiner

*Primary Examiner* — Sultana Begum
(74) *Attorney, Agent, or Firm* — Fletcher Yoder, P.C.

(57) ABSTRACT

A boost circuit is used to provide boosting voltage to a common boost node of a plurality of sub-word line drivers in memory systems and devices. The boost circuit includes a Metal Insulator Metal Capacitor. By using the boost circuit, the plurality of sub-word line drivers are configured to output a certain voltage to local word lines without using high DC generators to generate high voltages (4.2 volts or more). The area of the semiconductor substrate used for fabricating the sub-word line drivers is reduced, and thus reduce the cost or increasing the capacity of the memory devices.

20 Claims, 8 Drawing Sheets

SUB-WORD LINE DRIVER HAVING COMMON GATE BOOSTED VOLTAGE

BACKGROUND OF THE INVENTION

Field of the Invention

The present invention relates generally to the field of semiconductor memory devices. More specifically, embodiments of the present disclosure relate to signal drivers for word line circuits and methods of driving a word line in a memory device.

Description of the Related Art

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, may retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

Memory devices employ a variety of signals within the various circuits of the memory device. Signal drivers for applying the signals to signal lines are commonly used in electronic devices, such as integrated circuits. One such signal driver may be used to apply voltages to word lines in an array of memory cells. The word lines may extend through a memory cell array from a set of global word line drivers (also referred to herein as "main word line drivers" and "MWDs"). The global word line driver may selectively actuate each of the word lines responsive to the memory device receiving a row address corresponding to the word line. Each of the memory cells in the row corresponding to the received row address then applies stored data to a respective sense amplifier.

Memory cell arrays may be divided into smaller memory cell arrays, and local word line drivers (also referred to herein as "sub-word line drivers" and "SWDs") may be fabricated between at least some of these smaller memory cell arrays. The local word line drivers may receive substantially the same signals that are used to control the global word line drivers to drive the word lines so that they may apply the same levels to the word lines that the global word line driver applies to the word lines. In the local word line drivers, DC generators generating voltages higher than a certain value (e.g., 4.2 or more volts) may cause reliability issues. Booster circuits providing boosting voltages may be used to avoid using high voltages (e.g., 4.2 or more volts) in the local word line drivers. However, adding the booster circuits in the SWD circuits may take extra SWD layout area and may greatly increase the area of a semiconductor substrate (i.e., reduce array efficiency (AE)), thereby potentially either increasing the cost or reducing the capacity of the memory devices. It may be desirable to design the sub-word line drivers to save the SWDs layout area.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
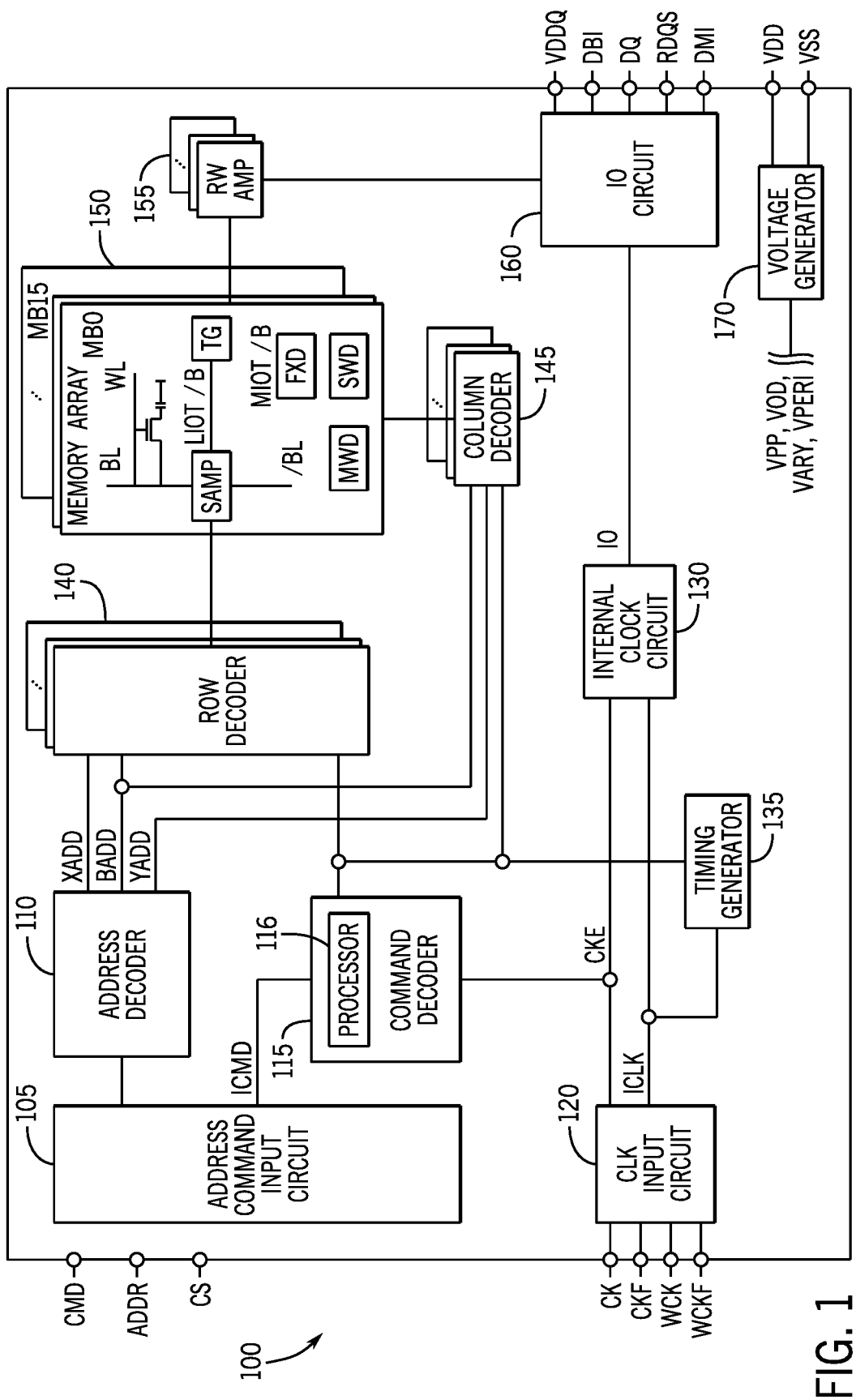
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In memory devices, word lines may extend through a memory cell array from a set of global word line drivers (i.e., main word line drivers or MWDs). The global word line driver may selectively actuate each of the word lines responsive to the memory device receiving a row address corresponding to the word line. Each of the word lines extending through the array may be relatively long and, as a result, may have substantial capacitance. Furthermore, the word lines may be fabricated of polysilicon, which may have a relatively high resistance. The combination of the relatively high capacitance and relatively high resistance of the word lines may make it difficult for the global word line driver to quickly switch signal levels on the word lines, particularly in portions of the memory cell array that are more distant from the global word line driver. To alleviate this problem, memory cell arrays may be divided into smaller memory cell arrays, and local word line drivers (i.e., sub-word line drivers, or SWDs) may be fabricated between at least some of these smaller memory cell arrays. The use of local word line drivers may improve the switching speed of word lines. The local word line drivers may receive substantially the same signals that are used to control the global word line drivers to drive the word lines so that they may apply the same levels to the word lines that the global word line driver applies to the word lines.

In SWD circuits, DC generators generating voltages higher than a certain value (e.g., 4.2 or more volts) may cause reliability issues. Booster circuits providing boosting voltages may be used to avoid using high voltages (e.g., 4.2 or more volts) in the SWD circuits. However, adding the booster circuits in the SWD circuits may take extra SWD layout area and may greatly increase the area of a semiconductor substrate (i.e., reduce array efficiency (AE)), thereby potentially either increasing the cost or reducing the capacity of the memory devices. NMOS transistors used in the local word line drivers may be fabricated in the same p-type substrate as the access transistors for the memory cells, while the PMOS transistors used in the local word drivers may require the fabrication of an n-well in the p-type substrate to provide the n-type material for the fabrication of the PMOS transistors. Forming an n-well for each of the local word line drivers may greatly increase the area of a semiconductor substrate used for fabricating the local word line drivers, thereby potentially either increasing the cost or reducing the capacity of the memory devices. Consequently, it may be beneficial to use NMOS transistors in the local word line drivers. However, it should be noted that, PMOS transistors may still be used in the local word line drivers with technology and associated circuits to reduce the SWD layout area used by the booster circuits. Accordingly, the area of the semiconductor substrate used for fabricating the local word line drivers may be reduced by using technology and associated circuits to reduce the SWD layout area used by the booster circuits.

The current disclosure herein provides a technology and associated circuits related to using sub-word line drivers having common gate boosted voltage in memory systems and devices. The area of the semiconductor substrate used for fabricating the local word line drivers may be reduced by using sub-word line drivers having common gate boosted voltage, thereby reducing the cost or increasing the capacity of the memory devices.

Turning now to the figures, FIG. 1 is a block diagram schematically illustrating a memory device 100 in accordance with an embodiment of the present technology. The memory device 100 may employ a plurality of external terminals to communicate with an external memory controller and/or host processor (not shown). The external terminals may include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, VDDQ, and VSSQ.

The command terminals and address terminals may be supplied with an address signal and a bank address signal from the external memory controller and/or host processor. The address signal and the bank address signal supplied to the address terminals may be transferred, via a command/address input circuit 105, to an address decoder 110. The address decoder 110 may receive the address signals and supply a decoded row address signal (XADD) to a row decoder 140, and a decoded column address signal (YADD) to a column decoder 145. The address decoder 110 may also receive the bank address signal (B ADD) and supply the bank address signal to both the row decoder 140 and the column decoder 145.

The memory device 100 may include an array of memory cells, such as memory array 150. The memory array 150 may include one or more banks MB (e.g., banks MB0 to MB15 in the example of FIG. 1), and each bank may include a plurality of word lines (WL), one or more bit lines (BL), and one or more memory cells arranged at intersections of the word lines and the bit lines. The selection of a word line WL and the signal voltage on the word line WL may be performed by the row decoder 140 in combination with the corresponding MWDs, SWDs, and FX phase drivers ("FX drivers," "phase drivers," or "FXDs"). The MWDs, SWDs, and FXDs are discussed in further detail below. The selection of a bit line BL may be performed by the column decoder 145. Sense amplifiers (SAMP) may be provided for corresponding bit lines BL and coupled to at least one respective local I/O line pair (LIOT/B), which may in turn be coupled to at least respective one main I/O line pair (MIOT/B), via transfer gates (TG), which may function as switches.

The command and address terminals may be supplied with command signals CMD, address signals ADDR, and chip selection signals CS, from a memory controller. The command signals may represent various memory commands from the memory controller (e.g., including access commands, which may include read commands and write commands). The select signal CS may be used to select the memory device 100 to respond to commands and addresses provided to the command and address terminals. When an active CS signal is provided to the memory device 100, the commands and addresses may be decoded and memory operations may be performed. The command signals CMD may be provided as internal command signals ICMD to a command decoder 115 via the command/address input circuit 105. The command decoder 115 may include a processor 116 and/or other circuits to decode the internal command signals ICMD to generate various internal signals and commands for performing memory operations. For example, the processor 116 may execute the instructions to and/or other circuits may be configured to generate row and column command signals and/or the associated timing signals (e.g., in coordination with the timing generator 135) to select a word line and/or a bit line to perform the desired memory operation. Of course, the processor/circuitry to generate the command and/or timing signals may be located in another component of the memory device 100 such as, for example, address command input circuit 105 and/or an external controller/processor. The internal command signals may also include output and input activation commands, such as clocked command CMDCK.

When a read command is issued and a row address and a column address are timely supplied with the read command, read data may be read from memory cells in the memory array 150 designated by the row address and column address. The read command may be received by the command decoder 115, which may provide internal commands to an input/output circuit 160 so that read data may be output from the data terminals DQ, RDQS, DBI, and DMI via read/write amplifiers 155 and the input/output circuit 160 according to the RDQS clock signals.

When a write command is issued and a row address and a column address are timely supplied with the command, write data may be supplied to the data terminals DQ, DBI, and DMI according to the WCK and WCKF clock signals. The write command may be received by the command decoder 115, which may provide internal commands to the input/output circuit 160 so that the write data may be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. Operation of the I/O circuit 160 is known to those skilled in the art and thus, for brevity, will not be discussed.

The power supply terminals may be supplied with power supply potentials VDD and VSS. These power supply potentials VDD and VSS may be supplied to an internal voltage generator circuit 170. The internal voltage generator circuit 170 may generate various internal potentials VPP, VOD, VARY, VPERI, VCC, VCCP, VCCP2, and the like based on the power supply potentials VDD, VNWL, and VSS. The internal potential VPP may be used in the row decoder 140, the internal potentials VOD and VARY may be used in the sense amplifiers included in the memory array 150, and the internal potential VPERI may be used in many other circuit blocks.

A clock input circuit 120 may receive an external clock signal and generate various internal clock signals. For example, the clock input circuit 120 may receive the external clock signals to generate internal clock signals ICLK. The internal clock signals ICLK may be supplied to an internal clock circuit 130. The internal clock circuit 130 may provide various phase and frequency controlled internal clock signal based on the received internal clock signals ICLK and a clock enable signal CKE from the command/address input circuit 105. For example, the internal clock circuit 130 may include a clock path (not shown in FIG. 1) that receives the internal clock signal ICLK and provides various clock signals to the command decoder 115. The internal clock circuit 130 may further provide input/output (IO) clock signals. The IO clock signals may be supplied to the input/output circuit 160 and may be used as a timing signal for determining an output timing of read data and the input timing of write data. The IO clock signals may be provided at multiple clock frequencies so that data may be output from and input to the memory device 100 at different data rates. A higher clock frequency may be desirable when high memory speed is desired. A lower clock frequency may be desirable when lower power consumption is desired. The internal clock signals ICLK may also be supplied to a timing generator 135 and thus various internal clock signals may be generated.

Figure 2:
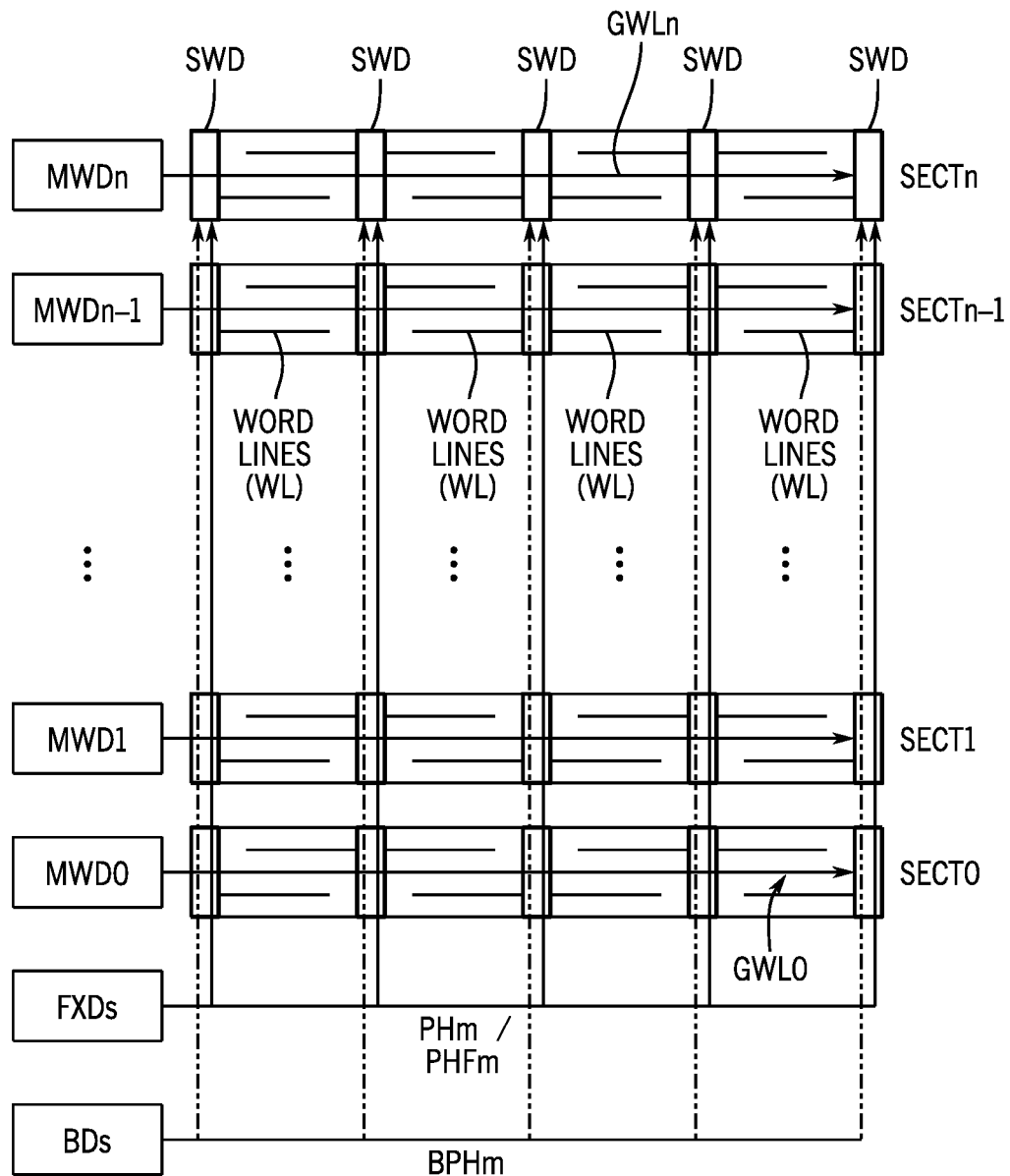
FIG. 2 illustrates a block diagram illustrating signals transmitting in a memory bank of FIG. 1, according to an embodiment of the present disclosure.

FIG. 2 illustrates a simplified block diagram of a structure of a memory bank MB of the memory array 150. As shown in FIG. 2, each memory bank MB may include one or more memory array sections SECT (e.g., SECT0 to SECTn, n=0, 1, 2 . . . ) having a group of memory cells. Each memory array section SECT includes an MWD (e.g., MWD0 to MWDn, n=0, 1, 2 . . . ) which outputs the appropriate signal voltage on the corresponding global word line GWL (e.g., GWL0 to GWLn, n=0, 1, 2 . . . ). For example, when in an active or high state, the MWD may output a voltage level on the global word line GWL that is at Vcc (e.g., in a range from about 2.3 volts to 2.7 volts such as, for example, 2.5 volts), at Vccp (e.g., in a range from about 3.0 volts to 3.5 volts such as, for example, 3.2 volts), or at some other voltage level corresponding to an active or high state. When in a pre-charge or standby state, the MWD may output a voltage level on the global word line GWL that is at Vss (e.g., ground or 0 volts), at Vnwl (e.g., in a range from about −0.1 volts to −0.25 volts such as, for example, −0.2 volts), or at some other voltage level corresponding to a pre-charge or standby state. When row hammer stress mitigation is enabled, during the transition from the active or high state to the pre-charge or standby state, the MWD may output an intermediate voltage level on the global word line GWL that is at Voff (e.g., 0.25 volts to 0.75 volts such as, for example, 0.5 volts).

While the global word line GWL may be directly coupled to the memory cells in the memory bank MB, the global word line GWL extending through the memory bank MB may have substantial capacitance and resistance, as discussed above. The capacitance and resistance may reduce the speed at which each MWD drives the respective global word line GWL. To mitigate this problem, each global word line GWL may be coupled to one or more SWDs. For example, in some embodiments, each global word line may connect to eight SWDs, sixteen SWDs, or some other desired number of SWDs. The SWDs may be fabricated between at least some of the memory cell arrays in memory bank MB. Each SWD outputs the appropriate signal voltage on the corresponding local word line WL (e.g., WL0 to WLn, n=0, 1, 2 . . . ). For example, when in an active or high state, the SWD may output a voltage level on the local word line WL that is at Vcc (e.g., in a range from about 2.3 volts to 2.7 volts such as, for example, 2.5 volts), at Vccp (e.g., in a range from about 3.0 volts to 3.5 volts such as, for example, 3.2 volts), or at some other voltage level corresponding to an active or high state. When in a pre-charge or standby state, the SWD may output a voltage level on the local word line WL that is at Vss (e.g., ground or 0 volts), at Vnwl (e.g., in a range from about −0.1 volts to −0.25 volts such as, for example, −0.2 volts), or at some other voltage level corresponding to a pre-charge or standby state. When row hammer stress mitigation is enabled, during the transition from the active or high state to the pre-charge or standby state, the SWD may output an intermediate voltage level on the local word line WL that is at Voff (e.g., 0.25 volts to 0.75 volts such as, for example, 0.5 volts). Depending on the type of SWD circuit, the high signal voltage value on the local word line WL may be the same as that of the global word line GWL or lower than that of the global word line GWL by a transistor threshold voltage Vt.

Each memory bank MB may include one or more FXDs that provide phase signals PHm and PHFm (m=0, 1, 2 . . . ), which are used to select the SWD based on decoded row address signals and timing control signals. For example, the PHm and PHFm signals may be set to appropriate states by the FXDs to place the corresponding SWD in an active state, intermediate voltage state, or pre-charge state. As illustrated in FIG. 2, the PHm and/or PHFm signals may be provided to a SWD in one or more sections SECT0-SECTn for selecting the appropriate SWD. In some embodiments, each set of PHm/PHFm signals from a FXD may be coupled to a SWD in each of a predetermined number of sections in sections SECT0 to SECTn. The predetermined number of sections may be seven sections, and the set of PHm/PHFm signals may be coupled to a SWD in each of the seven sections. However, in other embodiments, the predetermined number may be more than seven sections or less than seven sections.

In SWD circuits, DC generators generating voltages higher than a certain value (e.g., 4.2 or more volts) may cause reliability issues. Boost circuits providing boosting voltages may be used to avoid using high voltages (e.g., 4.2 or more volts) in the SWD circuits. However, adding the boost circuits in the SWD circuits may take extra SWD layout area and may greatly increase the area of a semiconductor substrate, thereby potentially either increasing the cost or reducing the capacity of the memory devices. In FIG. 2, each memory bank MB may include one or more boost drivers (BDs) that provide boosting signals BPHm (m=0, 1, 2, . . . ), which are used with the PHm signals to generate boosting voltages for the SWDs, thereby saving the SWD layout area.

Figure 3:
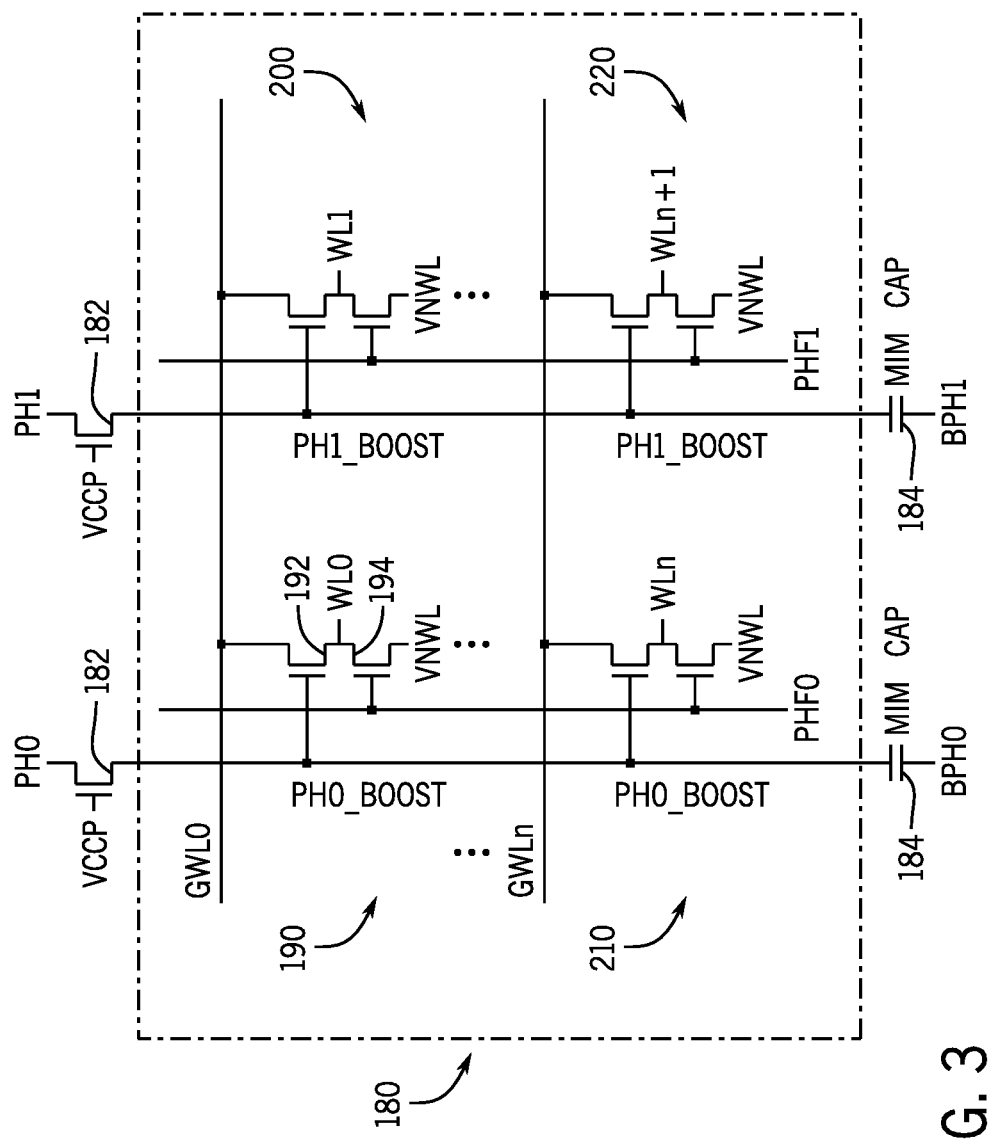
FIG. 3 illustrates a block diagram of an embodiment of boost circuits, according to an embodiment of the present disclosure.

FIG. 3 illustrates an embodiment of boost circuits using sub-word line drivers having common gate boosted voltage to reduce/save the SWD layout area. FIG. 3 shows a portion of the SWD layout area 180 with SWDs located at edges of the SWD layout area (e.g., a part of the section SECT0 for GWL0 and a part of the section SECTn for GWLn). In FIG. 3, two SWDs using only NMOS transistors are shown for each global word line GWL (e.g., GWL0, GWLn). That is, the SWDs in FIG. 3 are NMOS-only SWDs (i.e., no PMOS transistors are used). It should be noted that, although only NMOS transistors are used in the embodiment illustrated in FIG. 3, PMOS transistors may be used in the boost circuits in certain embodiment. In FIG. 3, those SWDs that use a same set of PH/PHF phase signals (e.g., PH0/PHF0, or PH1/PHF1) are coupled to a same NMOS transistor 182 and a same MIM Cap (Metal Insulator Metal Capacitor) 184. It should be noted that, although MIM Cap is used in the illustrated embodiment, other types of capacitors may be used in the boost circuits to reduce/save the SWD layout area. It should also be noted that, although the MIM Cap 184 is located outside of the SWD layout area 180 in the illustrated embodiment in FIG. 3, the MIM Cap or a portion of the MIM Cap may be located inside the SWD layout area in other embodiment. The sources of the transistors 182 are coupled to the phase signals PH (e.g., PH0, PH1), and the gates of the transistors 182 are coupled to the voltage Vccp. One side of each MIM Cap 184 is coupled to the drain of the corresponding transistor 182 and the other side of each MIM Cap 184 is coupled to the corresponding boosting signal BPH (e.g., BPH0, BPH1) generated by one or more boost drivers BDs. The MIM Cap 184 will be described in detail in FIG. 4. For example, in FIG. 3, SWDs 190 and 200 are coupled to the global word line GWL0, and SWDs 210 and 220 are coupled to the global word line GWLn, while SWDs 190 and 210 use the same set of phase signals PH0/PHF0, and SWDs 200 and 220 use the same set of phase signals PH1/PHF1. SWDs 190 and 210 are coupled to the same NMOS transistor 182 and the same MIM Cap 184. And SWDs 200 and 220 are coupled to the same NMOS transistor 182 and the same MIM Cap 184. It should be noted that more than two SWDs may be coupled to each global word line GWL, and more than two SWDs may be coupled to the same NMOS transistor 182 and the same MIM Cap 184. Each of the SWDs 190, 200, 210, and 220 may output a local word line WL0, WL1, WLn, and WLn+1, respectively. As illustrated in FIG. 3, the configuration of each of the SWDs 190, 200, 210, and 220 may be the same. Accordingly, for brevity, only the configuration and operation of the SWD 190 will be discussed.

The SWD 190 may include an NMOS transistor 192 (pull up NMOS), which acts as pull-up circuit, and an NMOS transistor 194 (pull down NMOS), which acts as a pull-down circuit. The drain of the transistor 192 is coupled to a drain of the transistor 194. The intercoupled drains of the transistors 192 and 194 are coupled to a local word line WL0. The source of the transistor 192 is coupled to the corresponding global word line GWL0, and the source of the transistor 194 is coupled to a low voltage source that is in a range of −0.2 volts to 0 volts. For example, the low voltage source of transistor 194 may be Vnwl as shown in FIG. 3. In some embodiments, the low voltage source may be Vss or some other low voltage source. The gate of the transistor 192 is coupled to the drain of the corresponding transistor 182 via a common boost node PH0_BOOST, which is also used by the corresponding transistor in the SWD 210 to couple to the drain of the same transistor 182. As shown in FIG. 3, the selection of the SWD and thus the word line WL for accessing the appropriate memory cell is determined by the PH/PHF signals (i.e., PH0/PHF0 or PH1/PHF1 in the embodiment of FIG. 3) corresponding to decoded row address signals. The operation of the SWDs are described in detail in FIGS. 5 and 6. It should be noted that, as discussed above, each set of PH/PHF (e.g., PH0/PHF0, PH1/PHF1) phase signals may be coupled to a SWD in a predetermined number of sections in sections SECT0 to SECTn, while FIG. 3 only illustrates corresponding SWDs (i.e., SWDs 190 and 200) in the section SECT0 and the section SECTn (i.e., SWDs 210 and 220).

Figure 4:
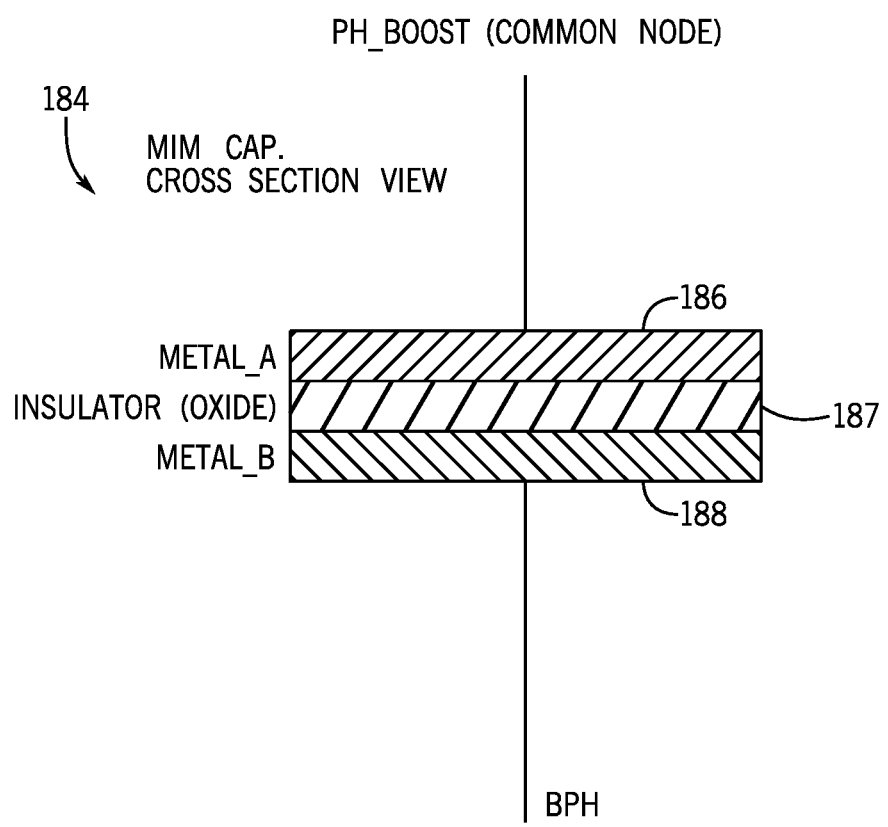
FIG. 4 illustrates a block diagram of a cross section of a capacitor used in boost circuits, according to an embodiment of the present disclosure.

FIG. 4 shows a cross section of a MIM Cap. 184. Each MIM Cap includes two metal layers, Metal_A 186 and Metal_B 188, and a layer of insulator (e.g., dielectric materials such as oxide) 187 located between the two metal layers. One metal layer of the MIM Cap (e.g., the Metal_B 188) is coupled to a corresponding boosting signal BPH (e.g., BPH0), and the other metal layer (e.g., the Metal_A 186) is coupled to a corresponding PH (e.g., PH0) signal via a common boost node, such as PH0_BOOST, as illustrated in FIG. 3. When the boosting signal BPH is at a high value (e.g., about 3.0 volts), the MIM Cap is charged by the boosting signal BPH to provide boosting voltage to the corresponding common boost node, e.g., PH0_BOOST. It should be noted that the boosting signal BPH may use any voltage to adjust the voltage at the common boost node according to SWD performance or reliability.

Figure 5:
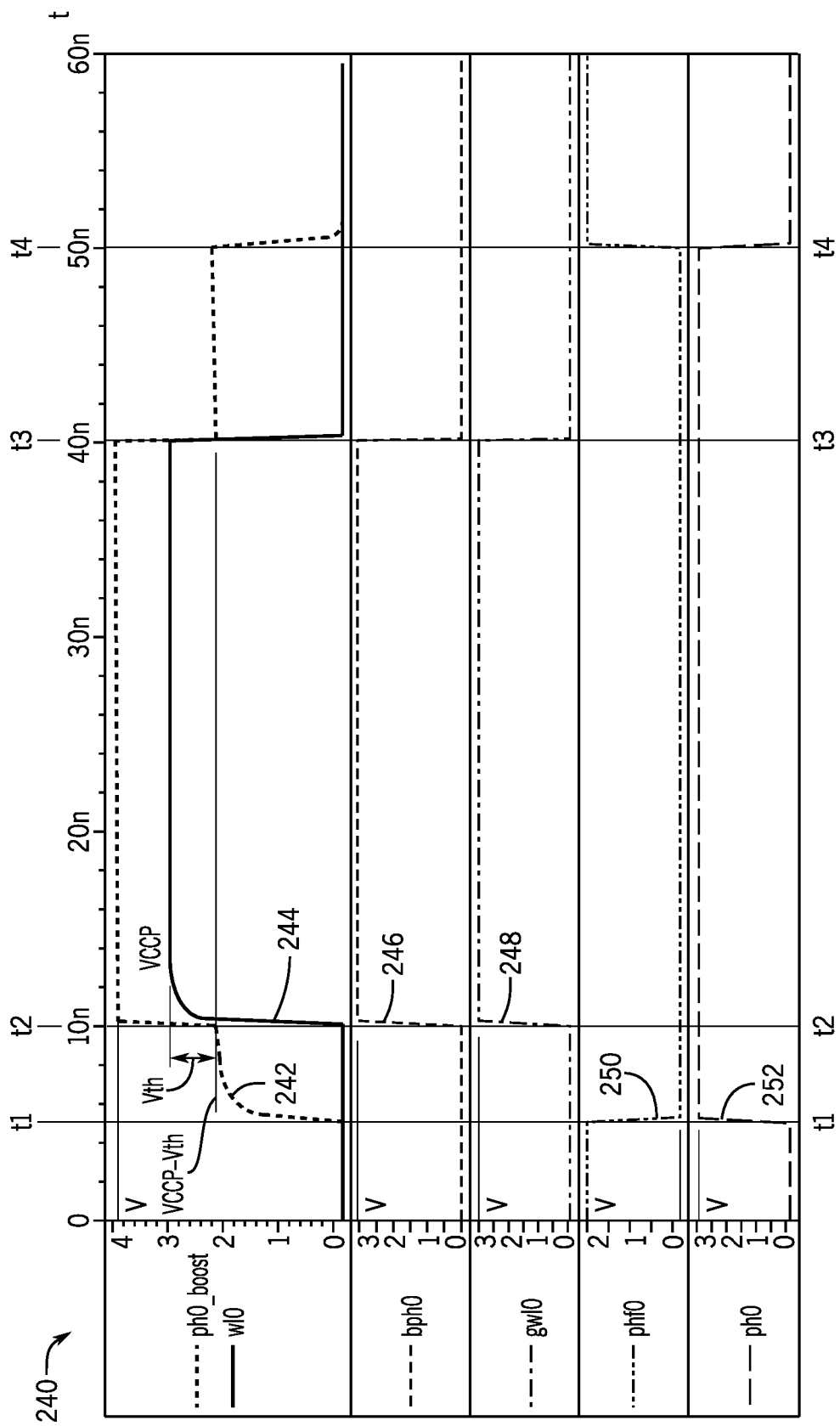
FIG. 5 illustrates an embodiment of a timing diagram for implementing boost circuits, according to an embodiment of the present disclosure.

FIG. 5 illustrates an embodiment of a timing diagram 240 that may be used to operate a SWD using a boost signal BPH (e.g., BPH0) to turn on (i.e., in active or intermediate state) and turn off (i.e., in a pre-charge or standby state) the corresponding local word line WL (e.g., WL0). In diagram 240, a curve 242 shows the voltage with respect to time at the common boost node PH0_BOOST, a curve 244 shows the voltage with respect to time for the local word line WL0, a curve 246 shows the voltage with respect to time for the boosting signal BPH0, a curve 248 shows the voltage with respect to time for the global word line GWL0, a curve 250 shows the voltage with respect to time for the phase signal PHF0, and a curve 252 shows the voltage with respect to time for the phase signal PH0. At time t1, the signal PH0 turns high (e.g., about 3.0 volts) to charge the common boost node PH0_BOOST to a voltage of (Vccp−Vth), Vth is the threshold voltage of the transistor 182 (e.g., Vccp is in a range from about 3.0 volts to 3.5 volts and Vth is about 0.7 volts, then the value of Vccp−Vth is in a range from about 2.3 volts to 2.8 volts), and the signal PHF0 turns low (e.g., about 0 volts) to shut off the pull down NMOS transistor (i.e., the transistor 194). At time t2, the boosting signal BPH0 turns high (e.g., about 3.0 volts) to boost the common boost node PH0_BOOST from the voltage of (Vccp−Vth) to a boosted voltage with relative high voltage (e.g., higher than Vccp, such as 4.0 volts), and the global word line GWL0 turns high (e.g., about 3.0 volts) to enable the local word line WL0. The voltage on the local word line WL0 goes to Vccp due to the high voltage (e.g., 4.0 volts) at the common boost node PH_BOOST. At time t3, the boosting signal BPH0 turns low (e.g., about 0 volts) to disable the boosting voltage and the global word line GWL0 turns low (e.g., about 0 volts) to disable the local word line WL0, and the voltage at the common boost node PH0_BOOST is lowered to (Vccp −Vth). At time t4, the signal PH0 turns low (e.g., about 0 volts) to discharge the common boost node PH0_BOOST to a voltage around 0 volts, and the signal PHF0 turns high (e.g., about 2.0 volts) to turn on the pull down NMOS transistor (i.e., the transistor 194) to put the local word line WL0 in a pre-charge or standby state. It should be noted that, although only NMOS transistors are used in the embodiment illustrated in FIG. 5, PMOS transistors may be used in the boost circuits in certain embodiment.

Figure 6:
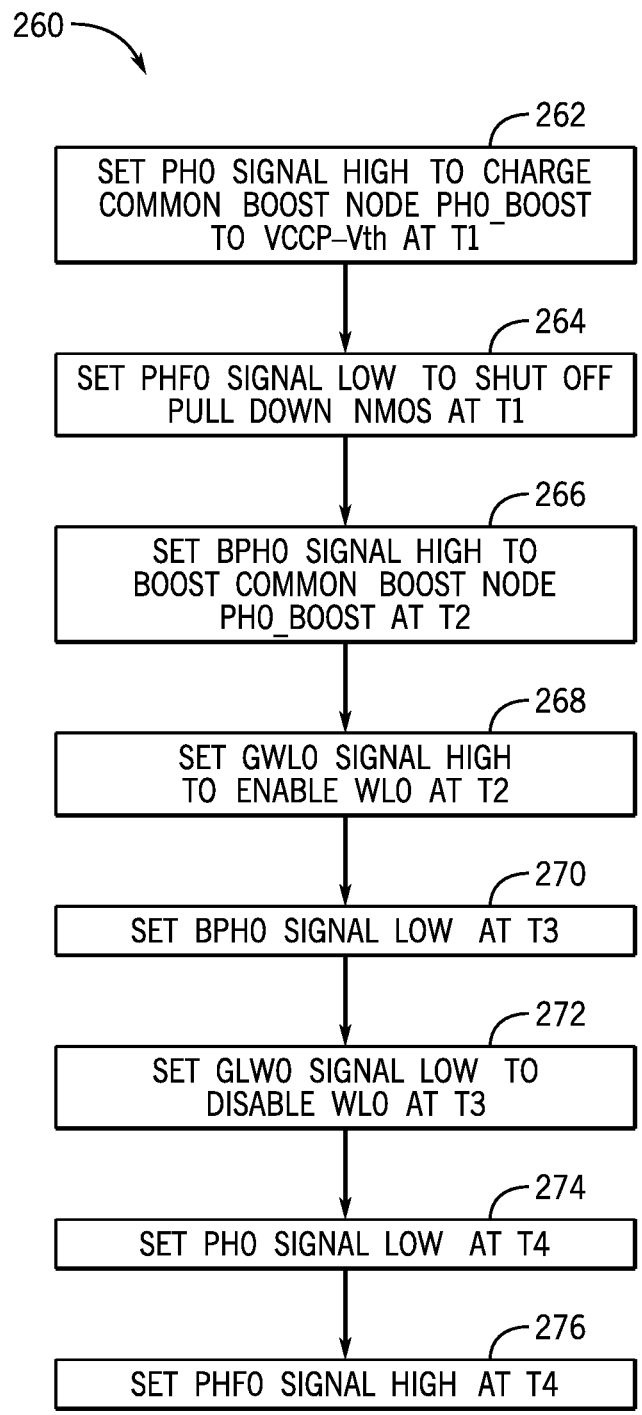
FIG. 6 illustrates a flow diagram of a method for implementing boost circuits, according to an embodiment of the present disclosure.

FIG. 6 illustrates a flow diagram of a method 260 for implementing a boosting signal BPH (e.g., BPH0) to charge a common boost node (e.g., PH0_BOOST) of the corresponding SWDs and turn on the corresponding local word line WL (e.g., WL0), as described in FIG. 5.

At block 262, the signal PH0 turns high (e.g., about 3.0 volts) to charge the common boost node PH0_BOOST to a voltage of (Vccp −Vth) (e.g., Vccp is in a range from about 3.0 volts to 3.5 volts and Vth is about 0.7 volts, then the value of Vccp −Vth is in a range from about 2.3 volts to 2.8 volts) at time t1. At block 264, the signal PHF0 turns low (e.g., about 0 volts) to shut off the pull down NMOS transistor (i.e., the transistor 194) at time t1. At block 266, the boosting signal BPH0 turns high (e.g., about 3.0 volts) to boost the common boost node PH0_BOOST from the voltage of (Vccp−Vth) to a boosted voltage with relative high voltage around 4.0 volts at time t2. At block 268, the global word line GWL0 turns high (e.g., about 3.0 volts) to enable the local word line WL0 at time t2. The voltage on the local word line WL0 goes to Vccp due to the high voltage (e.g., 4.0 volts) at the common boost node PH_BOOST. At block 270, the boosting signal BPH0 turns low (e.g., about 0 volts) to disable the boosting voltage at time t3, and the voltage at the common boost node PH0_BOOST is lowered to (Vccp −Vth). At block 272, the global word line GWL0 turns low (e.g., about 0 volts) to disable the local word line WL0 at time t3. At block 274, the signal PH0 turns low (e.g., about 0 volts) to discharge the common boost node PH0_BOOST to a voltage around 0 volts at time t4. At block 276, the signal PHF0 turns high (e.g., about 2.0 volts) to turn on the pull down NMOS transistor (i.e., the transistor 194) to put the local word line WL0 in a pre-charge or standby state. It should be noted that, although only NMOS transistors are used in the embodiment illustrated in FIG. 6, PMOS transistors may be used in the boost circuits in certain embodiment.

Figure 7:
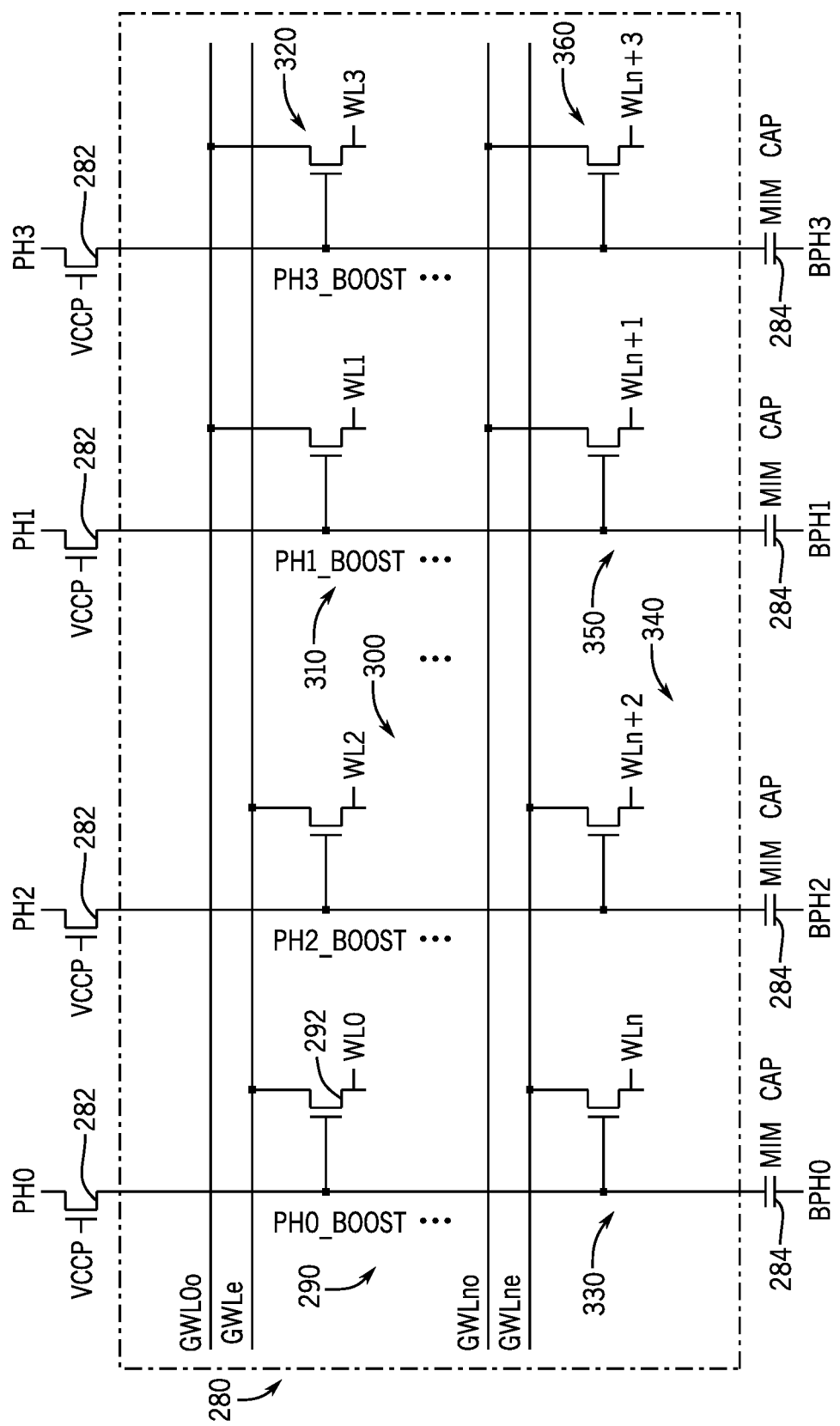
FIG. 7 illustrates a block diagram of a second embodiment of boost circuits, according to an embodiment of the present disclosure.

FIG. 7 illustrates another embodiment of boost circuits using a single transistor in a SWD. FIG. 7 shows a portion of the SWD layout area 280 with SWDs located at edges of the SWD layout area (e.g., a part of the section SECT0 for GWL0o and GWL0e, and a part of the section SECTn for GWLno and GWLne). The SWDs in FIG. 7 are NMOS-only SWDs (i.e., no PMOS transistors are used). It should be noted that, although only NMOS transistors are used in the embodiment illustrated in FIG. 7, PMOS transistors may be used in the boost circuits in certain embodiment. In FIG. 7, four SWDs corresponding to four phase signals PH (i.e., PH0, PH1, PH2, PH3) are shown for each pair of global word lines GWL (e.g., GWL0o and GWL0e, GWLno and GWLne). That is, in FIG. 7, instead of using phase signal sets PH/PHF to select the appropriate SWDs, a pair of global word lines, GWLo and GWLe, for each section SECTn (n=0, 1, 2, . . . ) are used together with the phase signal PH to select the appropriate SWDs. For instance, the phase signals PH with odd numbers (e.g., PH1 and PH3) are used with the odd global word lines GWL (e.g., GWL0o and GWLno), and the phase signals PH with even numbers (e.g., PH0 and PH2) are used with the even global word lines GWL (e.g., GWL0e and GWLne). In FIG. 7, those SWDs that use the same PH phase signal (e.g., PH0, or PH1, or PH2, or PH3) are coupled to a same NMOS transistor 282 and a same MIM Cap (Metal Insulator Metal Capacitor) 284. It should be noted that, although MIM Cap is used in the illustrated embodiment, other types of capacitors may be used in the boost circuits to reduce/save the SWD layout area. It should also be noted that, although the MIM Cap 284 is located outside of the SWD layout area 280 in the illustrated embodiment in FIG. 7, the MIM Cap or a portion of the MIM Cap may be located inside the SWD layout area in other embodiment. The sources of the transistors 282 are the phase signals PH (e.g., PH0, PH1, PH2, PH3), and the gates of the transistors 282 are coupled to the voltage Vccp. One side of each MIM Cap 284 is coupled to the drain of the corresponding transistor 282 and the other side of each MIM Cap 284 is coupled to the corresponding boosting signal BPH (e.g., BPH0, BPH1, BPH2, BPH3).

For example, in FIG. 7, SWDs 290 and 300 are coupled to the global word line GWL0e, and SWDs 310 and 320 are coupled to the global word line GWL0o; and SWDs 330 and 340 are coupled to the global word line GWLne, and SWDs 350 and 360 are coupled to the global word line GWLno. The SWDs 290 and 330 use the same phase signal PH0; the SWDs 300 and 340 use the same phase signal PH2; the SWDs 310 and 350 use the same phase signal PH1; the SWDs 320 and 360 use the same phase signal PH3. SWDs 290 and 330 are coupled to the same NMOS transistor 282 and the same MIM Cap 284; SWDs 300 and 340 are coupled to the same NMOS transistor 282 and the same MIM Cap 284; SWDs 310 and 350 are coupled to the same NMOS transistor 282 and the same MIM Cap 284; SWDs 320 and 360 are coupled to the same NMOS transistor 282 and the same MIM Cap 284. It should be noted that more than two SWDs may be coupled to each global word line GWL (e.g., GWL0e, or GWL0o, or GWLne, or GWLno), and more than two SWDs may be coupled to the same NMOS transistor 282 and the same MIM Cap 284. Each of the SWDs 290, 300, 310, 320, 330, 340, 350, and 360 may output a local word line WL0, WL2, WL1, WL3, WLn, WLn+2, WLn+1, and WLn+3, respectively. As seen in FIG. 7, the configuration of each of the SWDs may be the same. Accordingly, for brevity, only the configuration and operation of the SWD 290 will be discussed.

The SWD 290 may include an NMOS transistor 292. The drain of the transistor 292 is coupled a local word line WL0. The source of the transistor 292 is coupled to the global word line GWL0e. The gate of the transistor 292 is coupled to the drain of the corresponding transistor 282 via a common boost node PH0_BOOST, which is also used by the corresponding transistor in the SWD 330 to couple to the drain of the same transistor 282. As shown in FIG. 7, the selection of the SWD and thus the word line WL for accessing the appropriate memory cell is determined by the PH signals and the global word line GWL (e.g., PH0, PH1, PH2, PH3, GWL0o, GWL0e, GWLno, GWLne, in the embodiment of FIG. 7) corresponding to decoded row address signals. The operation of the SWDs are similar to the operation described in FIGS. 5 and 6 (except that no PHF signal is involved in the operation of the SWDs in FIG. 7).

Figure 8:
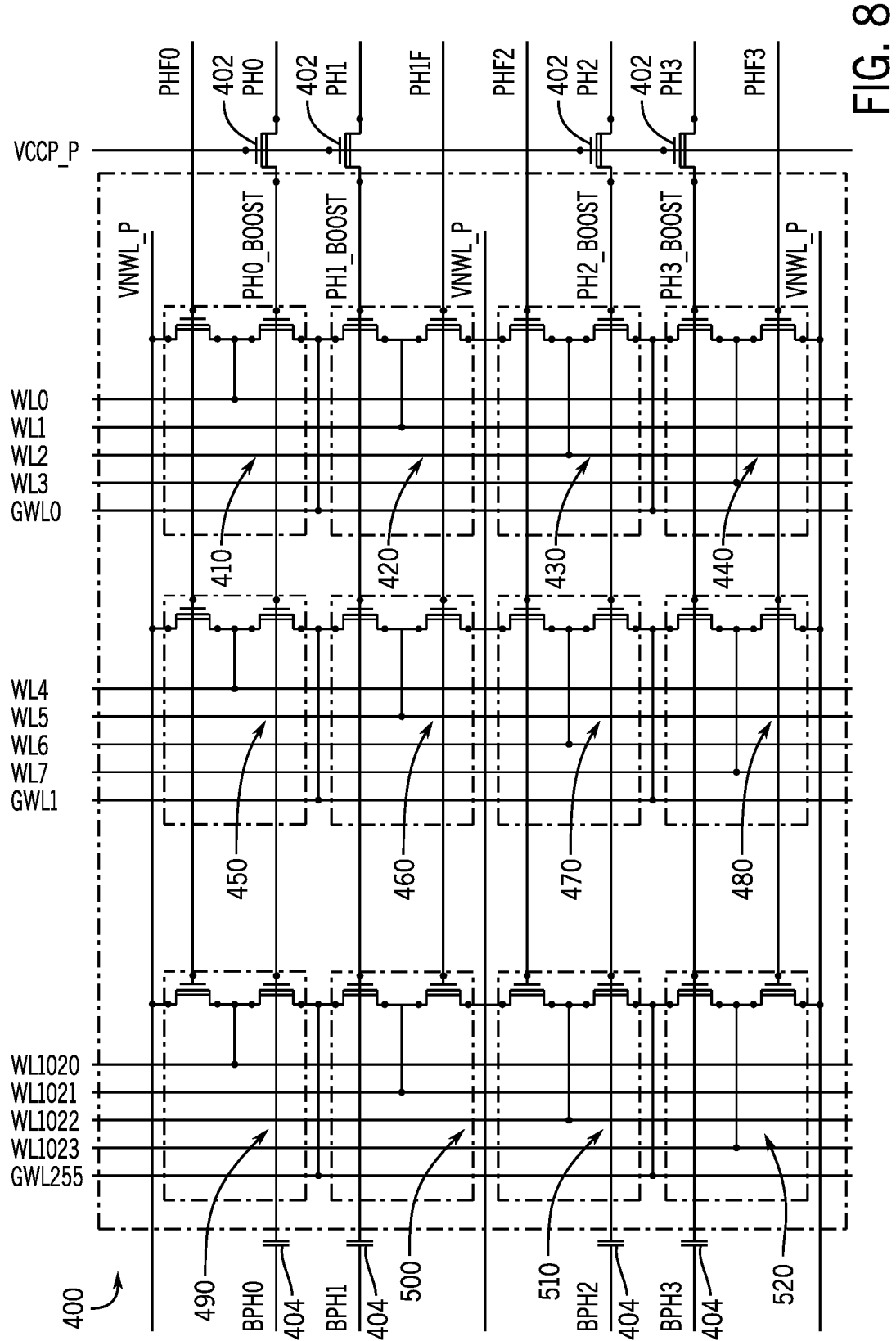
FIG. 8 illustrates a block diagram of a third embodiment of boost circuits, according to an embodiment of the present disclosure.

FIG. 8 illustrates another embodiment of boost circuits using four sets of PH/PHF (i.e., PH0/PHF0, PH1/PHF1, PH2/PHF2, PH3/PHF3) phase signals. FIG. 8 shows a portion of the SWD layout area 400 including SWDs located at edges of the SWD layout area (e.g., a part of the section SECT0 for GWL0, a part of the section SECT255 for GWL255). The SWDs in FIG. 8 are NMOS-only SWDs (i.e., no PMOS transistors are used), and each SWD has the similar configuration as the SWD in FIG. 3. It should be noted that, although only NMOS transistors are used in the embodiment illustrated in FIG. 8, PMOS transistors may be used in the boost circuits in certain embodiment. In FIG. 8, four SWDs corresponding to four sets of phase signals PH/PHF (i.e., PH0/PHF0, PH1/PHF1, PH2/PHF2, PH3/PHF3) are shown for each global word line GWL (e.g., GWL0, GWL1, GWL255). In FIG. 8, those SWDs that use the same PH phase signal (e.g., PH0, or PH1, or PH2, or PH3) are coupled to a same NMOS transistor 402 and a same MIM Cap (Metal Insulator Metal Capacitor) 404. It should be noted that, although MIM Cap is used in the illustrated embodiment, other types of capacitors may be used in the boost circuits to reduce/save the SWD layout area. It should also be noted that, although the MIM Cap 404 is located outside of the SWD layout area 400 in the illustrated embodiment in FIG. 8, the MIM Cap or a portion of the MIM Cap may be located inside the SWD layout area in other embodiment. The sources of the transistors 402 are the phase signals PH (e.g., PH0, PH1, PH2, PH3), and the gates of the transistors 402 are coupled to a voltage Vccp_P. The voltage Vccp_P is generally the same as the voltage Vccp, and its value may be adjusted to adjust the boosted voltage at the common boost node (e.g., PH0_BOOST, PH1_BOOST, PH2_BOOST, PH3_BOOST). One side of each MIM Cap 404 is coupled to the drain of the corresponding transistor 402 and the other side of each MIM Cap 404 is coupled to the corresponding boosting signal BPH (e.g., BPH0, BPH1, BPH2, BPH3).

For example, in FIG. 8, SWDs 410, 420, 430, and 440 are coupled to the global word line GWL0; SWDs 450, 460, 470, and 480 are coupled to the global word line GWL1; SWDs 490, 500, 510, and 520 are coupled to the global word line GWL255. The SWDs 410, 450, and 490 use the same phase signal PH0; The SWDs 420, 460, and 500 use the same phase signal PH1; The SWDs 430, 470, and 510 use the same phase signal PH2; The SWDs 440, 480, and 520 use the same phase signal PH3. SWDs 410, 450, and 490 are coupled to the same NMOS transistor 402, at the common boost node PH0_BOOST, and the same MIM Cap 404; SWDs 420, 460, and 500 are coupled to the same NMOS transistor 402, at the common boost node PH1_BOOST, and the same MIM Cap 404; SWDs 430, 470, and 510 are coupled to the same NMOS transistor 402, at the common boost node PH2_BOOST, and the same MIM Cap 404; SWDs 440, 480, and 520 are coupled to the same NMOS transistor 402, at the common boost node PH3_BOOST, and the same MIM Cap 404. Each of the SWDs may output a local word line (e.g., WL0, WL1 ... WL1023), respectively. The operation of the SWDs are similar to the operation described in FIGS. 5 and 6.

Accordingly, the technical effects of the present disclosure include a method and a system related to using sub-word line drivers having common gate boosted voltage in memory systems and devices.

In the illustrated embodiments above, the memory devices and systems are primarily described in the context of devices incorporating DRAM storage media. Memory devices configured in accordance with other embodiments of the present technology, however, may include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
  a boost driver configured to generate a boosting signal; and
  a capacitor configured to receive the boosting signal, wherein the capacitor is coupled to a phase signal via a common boost node used by a plurality of sub-word line drivers (SWDs) to couple to the phase signal, and wherein the capacitor is configured to provide a boost voltage to the plurality of SWDs, via the common boost node, when a global word line coupled to a particular sub-word line driver of the plurality of SWDs is at a first value.

2. The device of claim 1, wherein the common boost node is coupled to a gate of a respective transistor of each of the plurality of sub-word line drivers.

3. The device of claim 1, wherein the particular sub-word line driver comprises a local word line, and a voltage is output to the local word line from the particular sub-word line driver when the global word line coupled to the particular sub-word line driver is at the first value.

4. The device of claim 1, wherein the capacitor is a Metal Insulator Metal Capacitor (MIM Cap) comprising:
  a first metal layer;
  a second metal layer; and
  an insulator layer located between the first metal layer and the second metal layer, wherein the insulator layer comprises a dielectric material.

5. The device of claim 1, wherein the phase signal is coupled to the common boost node via a transistor.

6. The device of claim 1, wherein the phase signal is configured to charge the common boost node to a first voltage, wherein the first voltage is less than a power supply voltage.

7. The device of claim 6, wherein the boosting signal is configured to charge the common boost node to a second voltage, wherein the second voltage is more than the power supply voltage.

8. The device of claim 7, wherein the particular sub-word line driver is configured to output the power supply voltage to a local word line.

9. The device of claim 1, wherein each of the plurality of sub-word line drivers includes only one respective transistor.

10. A method comprising:
setting a phase signal to a first value to charge a common boost node to a first voltage, wherein the phase signal is coupled to a plurality of sub-word line drivers (SWDs) at the common boost node;
setting a boosting signal to a second value, wherein the boosting signal is received by a capacitor coupled to the phase signal at the common boost node, and wherein the capacitor is configured to boost the common boost node to a second voltage; and
receiving a global signal having a third value, wherein the global signal is configured to enable a particular sub-word line driver of the plurality of SWDs to output a third voltage to a local word line, and wherein the third voltage is determined at least in part based on the second voltage.

11. The method of claim 10, wherein the common boost node is coupled to a gate of a respective transistor of each of the plurality of SWDs.

12. The method of claim 10, wherein the capacitor is a Metal Insulator Metal capacitor device comprising:
a first metal layer;
a second metal layer; and
an insulator layer located between the first metal layer and the second metal layer, wherein the insulator layer comprises a dielectric material.

13. The method of claim 10, wherein the phase signal is coupled to the common boost node via a transistor.

14. The method of claim 10, wherein the first voltage is less than a power supply voltage.

15. The method of claim 14, wherein the second voltage is more than the power supply voltage.

16. The method of claim 15, wherein the third voltage is equal to the power supply voltage.

17. A tangible, non-transitory computer readable storage media storing instructions that, when executed by a processing device, cause the processing device to perform operations comprising:
setting a phase signal to a first value to charge a common boost node to a first voltage, wherein the phase signal is coupled to a plurality of sub-word line drivers (SWDs) at the common boost node;
setting a boosting signal to a second value, wherein the boosting signal is received by a capacitor coupled to the phase signal at the common boost node, and wherein the capacitor is configured to boost the common boost node to a second voltage; and
receiving a global signal having a third value, wherein the global signal is configured to enable a particular SWD of the plurality of SWDs to output a third voltage to a local word line, and wherein the third voltage is determined at least in part based on the second voltage.

18. The non-transitory computer readable storage media of claim 17, wherein the capacitor.

19. The non-transitory computer readable storage media of claim 17, wherein the capacitor is a Metal Insulator Metal Capacitor comprising:
a first metal layer;
a second metal layer; and
an insulator layer located between the first metal layer and the second metal layer, wherein the insulator layer comprises a dielectric material.

20. The non-transitory computer readable storage media of claim 17, wherein the common boost node is coupled to a gate of a respective transistor of each of the plurality of SWDs.

* * * * *